United States Patent
Kwak et al.

(10) Patent No.: US 11,355,688 B2
(45) Date of Patent: Jun. 7, 2022

(54) THERMOELECTRIC MODULE AND METHOD FOR MANUFACTURING THE SAME

(71) Applicants: Hyundai Motor Company, Seoul (KR); Kia Motors Corporation, Seoul (KR); Hee Sung Metal LTD., Incheon (KR)

(72) Inventors: Jin Woo Kwak, Gyeongsangbuk-do (KR); Byung Wook Kim, Gyeonggi-do (KR); Kyong Hwa Song, Gyeonggi-Do (KR); Byung Jin Hwang, Incheon (KR); Byeong Hoon Yeon, Incheon (KR); Kyoung Hyun Son, Incheon (KR); Jong Bae Kim, Gyeonggi-Do (KR); Seung Ho Yang, Incheon (KR); Jae Soung Park, Incheon (KR)

(73) Assignees: Hyundai Motor Company, Seoul (KR); Kia Motors Corporation, Seoul (KR); Hee Sung Metal LTD., Incheon (KR)

( * ) Notice: Subject to any disclaimer, the term of this patent is extended or adjusted under 35 U.S.C. 154(b) by 278 days.

(21) Appl. No.: 15/959,182

(22) Filed: Apr. 21, 2018

(65) Prior Publication Data
US 2019/0189887 A1   Jun. 20, 2019

(30) Foreign Application Priority Data
Dec. 18, 2017   (KR) .................. 10-2017-0174129

(51) Int. Cl.
H01L 35/32   (2006.01)
H01L 35/34   (2006.01)
H01L 35/20   (2006.01)
H01L 35/08   (2006.01)

(52) U.S. Cl.
CPC .............. *H01L 35/32* (2013.01); *H01L 35/08* (2013.01); *H01L 35/20* (2013.01); *H01L 35/34* (2013.01)

(58) Field of Classification Search
None
See application file for complete search history.

(56) References Cited

U.S. PATENT DOCUMENTS

| 8,841,540 B2 | 9/2014 | Moczygemba et al. |
| 2011/0303448 A1* | 12/2011 | Anderson ............... C22C 13/00 174/259 |

(Continued)

OTHER PUBLICATIONS

Lee et al., Interfacial REaction of Sn—Ag—Cu Lead=Free Solder Alloy on Cu: A Review, Advances in Materials Science and Engineering, Hindawi Publishing Corporation, vol. 2013, Article ID 123697, pp. 1-11 (Year: 2013).*

(Continued)

*Primary Examiner* — Jayne L Mershon
(74) *Attorney, Agent, or Firm* — Fox Rothschild LLP

(57) ABSTRACT

A thermoelectric module includes: an electrode; a double layer stacked on a thermoelectric pellet; and a solder layer interposed between the double layer and the electrode to bond the double layer to the electrode, the solder layer containing a Sn—Cu-based alloy. The solder layer is formed to have an interface with one of the double layer and the electrode and has at least one ε layer having an ε phase ($Cu_3Sn$).

7 Claims, 8 Drawing Sheets

(56) References Cited

U.S. PATENT DOCUMENTS

2013/0032188 A1* 2/2013 Kajihara ................ H01L 35/08
  136/200
2014/0096809 A1* 4/2014 Kim ........................ H01L 35/26
  136/205

OTHER PUBLICATIONS

Lee et al., Interfacial Reaction of Sn—Ag—Cu Lead-Free Solder alloy on Cu: A Review, Advances in Materials Science and Engineering, Advances in Materials Science and Engineering, vol. 2013, pp. 1-11 (Year: 2013).*

Pan et al., Effect of Reflow Profile on SnPb and SnAgCu Solder Joint Shear Force, presented at IPC APEX Expo, pp. 1-11 (Year: 2006).*

* cited by examiner

THERMOELECTRIC MODULE AND METHOD FOR MANUFACTURING THE SAME

CROSS-REFERENCE TO RELATED APPLICATION

This application is based on and claims the benefit of priority to Korean Patent Application No. 10-2017-0174129, filed on Dec. 18, 2017 in the Korean Intellectual Property Office, the disclosure of which is incorporated herein in its entirety by reference.

TECHNICAL FIELD

The present disclosure relates generally to thermoelectric technologies and, more particularly, to a thermoelectric module and a method for manufacturing the same.

BACKGROUND

Recently, use of thermoelectric modules has increased for recovering waste heat discharged from an apparatus, such as a vehicle. Thermoelectric modules recover heat using a Seebeck effect that generates electromotive force due to a difference in temperature between both ends of thermoelectric pellets.

Thermoelectric modules typically include an N-type thermoelectric pellet and a P-type thermoelectric pellet having opposite polarities and being alternately arranged, and further include an electrode electrically connecting the thermoelectric pellets with each other. In general, the thermoelectric pellets and the electrode are bonded to each other using an adhesive interposed between the thermoelectric pellets and the electrode. If the actual use temperatures of the thermoelectric pellets are higher than the melting point of the adhesive, the adhesive is melted causing damage to the thermoelectric module or increasing resistance between the thermoelectric pellets and the electrode.

To solve the above problems, conventionally, if the thermoelectric pellets are actually used at higher temperatures, the thermoelectric pellets and the electrode are bonded to each other using an adhesive, such as a brazing material, having a higher melting point. To bond thermoelectric pellets to the electrode using an adhesive having a higher melting point, the process of bonding the thermoelectric pellet to the electrode has to be performed inside a higher-temperature vacuum furnace under a higher temperature and vacuum atmosphere. However, if the process of bonding the thermoelectric pellet to the electrode is performed under the higher temperature and vacuum atmosphere, the thermoelectric pellets are frequently damaged. Furthermore, it is both difficult and costly to technically realize the higher temperature and vacuum atmosphere.

SUMMARY

The present disclosure has been made to solve the above-mentioned problems occurring in the related art while advantages achieved by the prior art are maintained intact.

An aspect of the present disclosure provides a thermoelectric module and a method for manufacturing the same, in which a process of bonding thermoelectric pellets to an electrode using an adhesive may be performed under a lower-temperature atmosphere, and the thermoelectric module may be improved for actual use without loss of the adhesive under a higher-temperature environment.

The technical problems to be solved by the present disclosure are not limited to the aforementioned problems, and any other technical problems not mentioned herein will be clearly understood from the following description by those skilled in the art to which the present disclosure pertains.

According to embodiments of the present disclosure, a thermoelectric module includes: an electrode; a double layer stacked on a thermoelectric pellet; and a solder layer interposed between the double layer and the electrode to bond the double layer to the electrode, the solder layer containing a Sn—Cu-based alloy, wherein the solder layer is formed to have an interface with one of the double layer and the electrode and has at least one ε layer having an ε phase ($Cu_3Sn$).

The double layer may include a diffusion barrier layer stacked on the thermoelectric pellet, and a Cu layer stacked on the diffusion barrier layer to be interposed between the diffusion barrier layer and the solder layer. The at least one ε layer may form a bonding interface with the Cu layer.

The diffusion barrier layer may contain at least one of Ta, W, and Mo.

The electrode may contain Cu, and the at least one ε layer may form a bonding interface with the electrode.

The double layer may include a diffusion barrier layer stacked on the thermoelectric pellet, and an Ni layer stacked on the diffusion barrier layer to be interposed between the diffusion barrier layer and the solder layer.

The solder layer may further contain Ag.

The solder layer may contain 31.5 wt % to 96.5 wt % of Sn, 0.5 wt % to 68 wt % of Cu, and 1.5 wt % to 68 wt % of Ag.

Furthermore, according to embodiments of the present disclosure, a method for manufacturing a thermoelectric module includes: forming a thermoelectric pellet complex including a thermoelectric pellet and a double layer stacked on the thermoelectric pellet; bonding the double layer to an electrode using a solder layer interposed between the double layer and the electrode, the solder layer containing a Sn—Cu-based alloy; and performing heat treatment such that at least one ε layer having an ε phase ($Cu_3Sn$) is formed at the solder layer to form a bonding interface with one of the double layer and the electrode.

The double layer may include a diffusion barrier layer stacked on the thermoelectric pellet and a Cu layer interposed between the diffusion barrier layer and the solder layer. The performing of the heat treatment may include forming the at least one ε layer by changing at least a portion of a Sn-rich phase and a η phase ($Cu_6Sn_5$), which are formed at the solder layer, to a ε phase ($Cu_3Sn$) due to Cu diffused from the Cu layer.

The bonding of the double layer to the electrode may include bonding the double layer to the electrode using the solder layer in a first atmosphere having a temperature which is greater than or equal to 350° C. and less than 400° C.

The performing of the heat treatment may include performing the heat treatment in a second atmosphere having a temperature which is greater than or equal to 400° C. and less than 500° C.

The bonding of the double layer to the electrode may further include causing a thermoelectric module, which is formed by aligning the thermoelectric pellet complex and the electrode such that the solder layer is interposed between the double layer and the electrode, to pass through a reflow solder oven.

The performing of the heat treatment may further include causing a thermoelectric module, which is formed by aligning the thermoelectric pellet complex and the electrode such that the solder layer is interposed between the double layer and the electrode, to pass through a reflow solder oven.

The electrode may contain Cu, and the performing of the heat treatment may include forming the at least one ε layer by changing at least a portion of a Sn-rich phase and a η phase ($Cu_6Sn_5$), which are formed at the solder layer, to the ε phase ($Cu_3Sn$) due to Cu diffused from the electrode layer.

The double layer may include a diffusion barrier layer stacked on the thermoelectric pellet and an Ni layer stacked on the diffusion barrier layer to be interposed between the diffusion barrier layer and the solder layer.

The solder layer may contain 31.5 wt % to 96.5 wt % of Sn, 0.5 wt % to 68 wt % of Cu, and 1.5 wt % to 68 wt % of Ag.

The forming of the thermoelectric pellet complex may include one of the following steps: sintering thermoelectric powders to form the thermoelectric pellet and source materials to form the double layer; stacking the double layer on the thermoelectric pellet, which is previously formed, through spray coating; stacking the double layer, which is previously formed, on the thermoelectric pellet, which is previously formed, through hot pressing; and stacking the double layer on the thermoelectric pellet, which is previously formed, through plating.

BRIEF DESCRIPTION OF THE DRAWINGS

The above and other objects, features and advantages of the present disclosure will be more apparent from the following detailed description taken in conjunction with the accompanying drawings.

Figure 1:
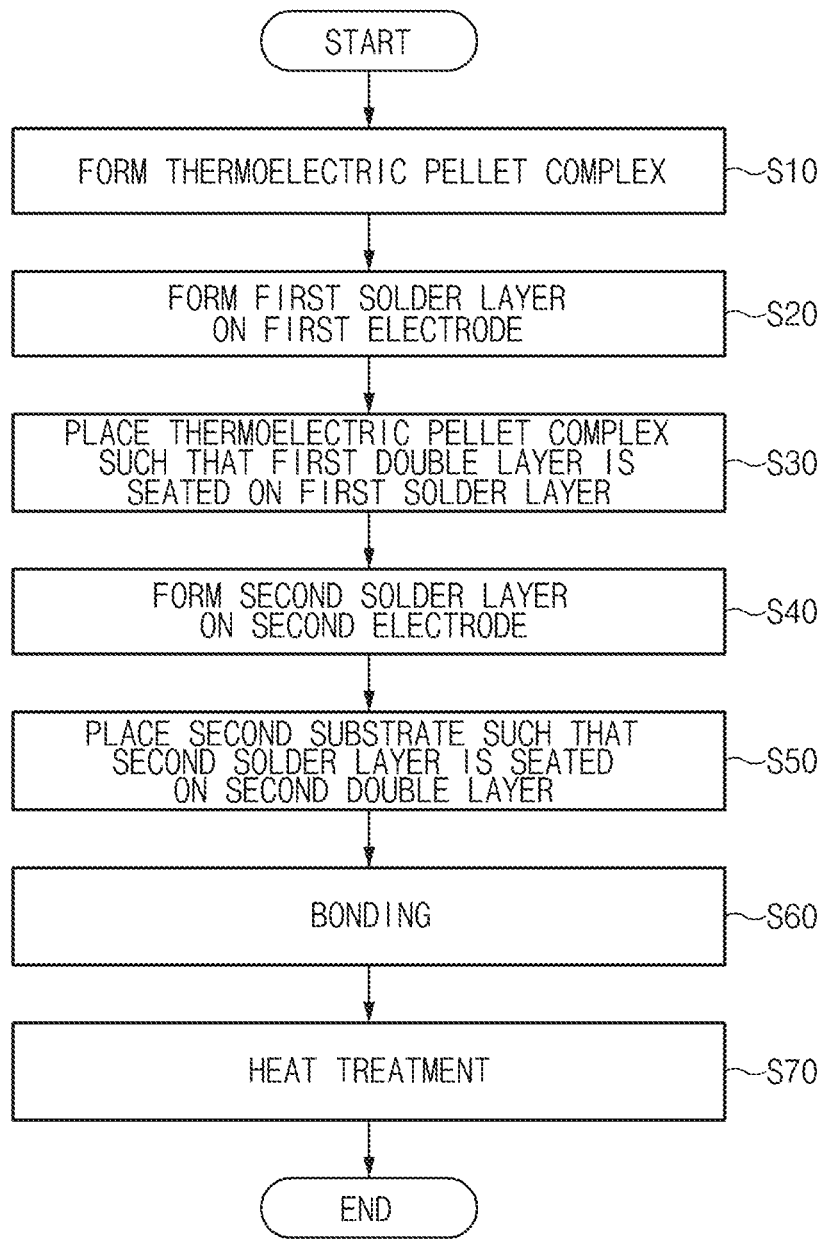
FIG. 1 is a flowchart illustrating a method for manufacturing a thermoelectric module, according to embodiments of the present disclosure.

It should be understood that the above-referenced drawings are not necessarily to scale, presenting a somewhat simplified representation of various preferred features illustrative of the basic principles of the disclosure. The specific design features of the present disclosure, including, for example, specific dimensions, orientations, locations, and shapes, will be determined in part by the particular intended application and use environment.

DETAILED DESCRIPTION OF THE EMBODIMENTS

Hereinafter, embodiments of the present disclosure will be described in detail with reference to the accompanying drawings. In the following description, the same reference numerals will be assigned to the same elements even though the elements are illustrated in different drawings. In addition, in the following description of embodiments of the present disclosure, a detailed description of well-known features or functions will be ruled out in order not to unnecessarily obscure the gist of the present disclosure.

In the following description of elements according to embodiments of the present disclosure, the terms 'first', 'second', 'A', 'B', '(a)', and '(b)' may be used. The terms are used only to distinguish relevant elements from other elements, and the nature, the order, or the sequence of the relevant elements is not limited to the terms. In addition, unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Referring now to the presently disclosed embodiments, FIG. 1 is a flowchart illustrating a method for manufacturing a thermoelectric module, according to embodiments of the present disclosure.

As illustrated in FIG. 1, according to embodiments of the present disclosure, the method for manufacturing a thermoelectric module 1 includes a step (S10) of forming a thermoelectric pellet complex 10 including a thermoelectric pellet 12 and a first double layer 14 and a second double layer stacked on both ends of the thermoelectric pellet 12, respectively, a step (S20) of forming a first solder layer 40 on a first electrode 20; a step (S30) of placing the thermoelectric pellet complex 10 such that the first double layer 14 is seated on the first solder layer 40, a step (S40) of forming a second solder layer 50 on a second electrode 30; a step (S50) of placing the second electrode 30 such that the second solder layer 50 is seated on the second double layer 16; a step (S60) of bonding the double layers 14 and 16 to the electrodes 20 and 30 using the solder layers 40 and 50, respectively; and a step (S70) of performing heat treatment such that the phases of the solder layers 40 and 50 are changed to increase the melting points of the solder layers 40 and 50.

Figure 2:
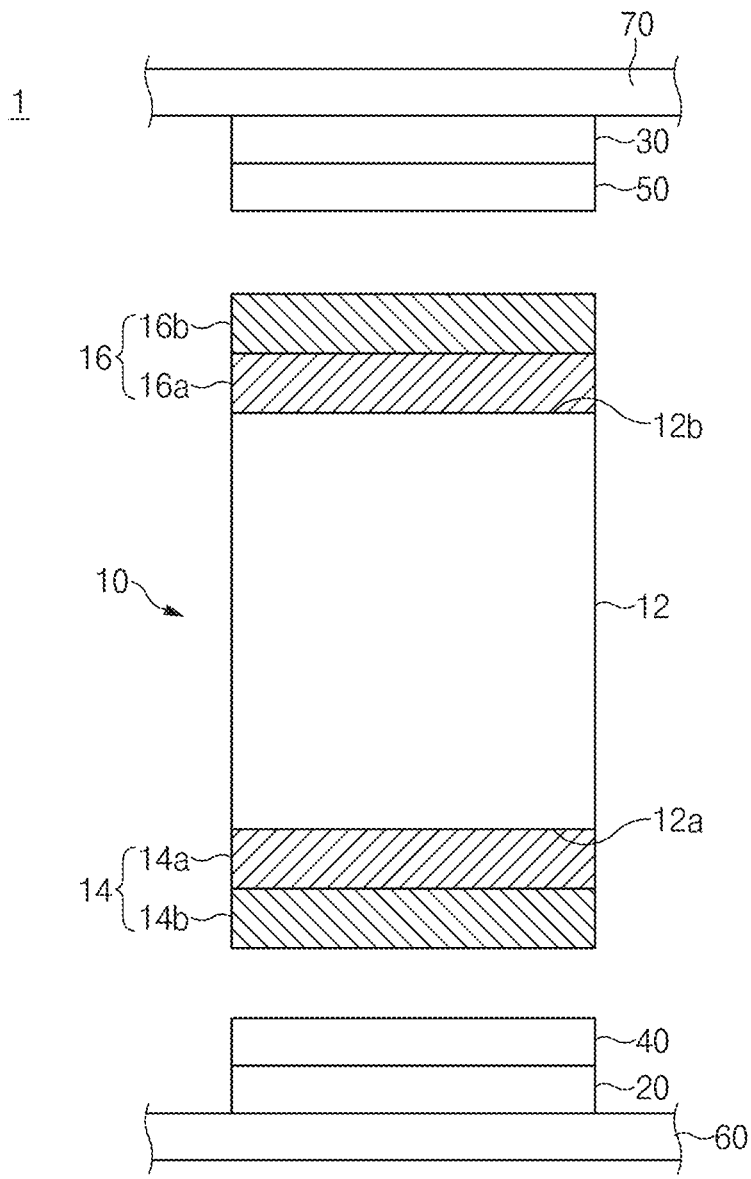
FIG. 2 is a view illustrating double layers stacked on a thermoelectric pellet.
Figure 3:
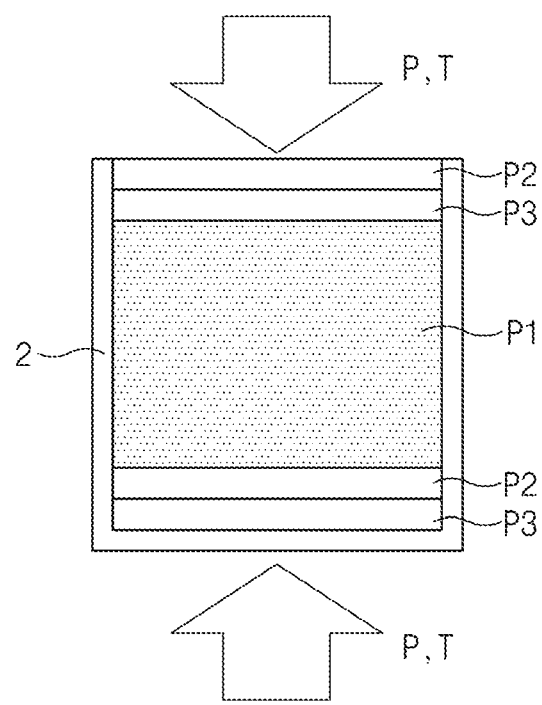
FIGS. 3 and 4 are views illustrating a manner for forming a thermoelectric pellet complex.
Figure 4:
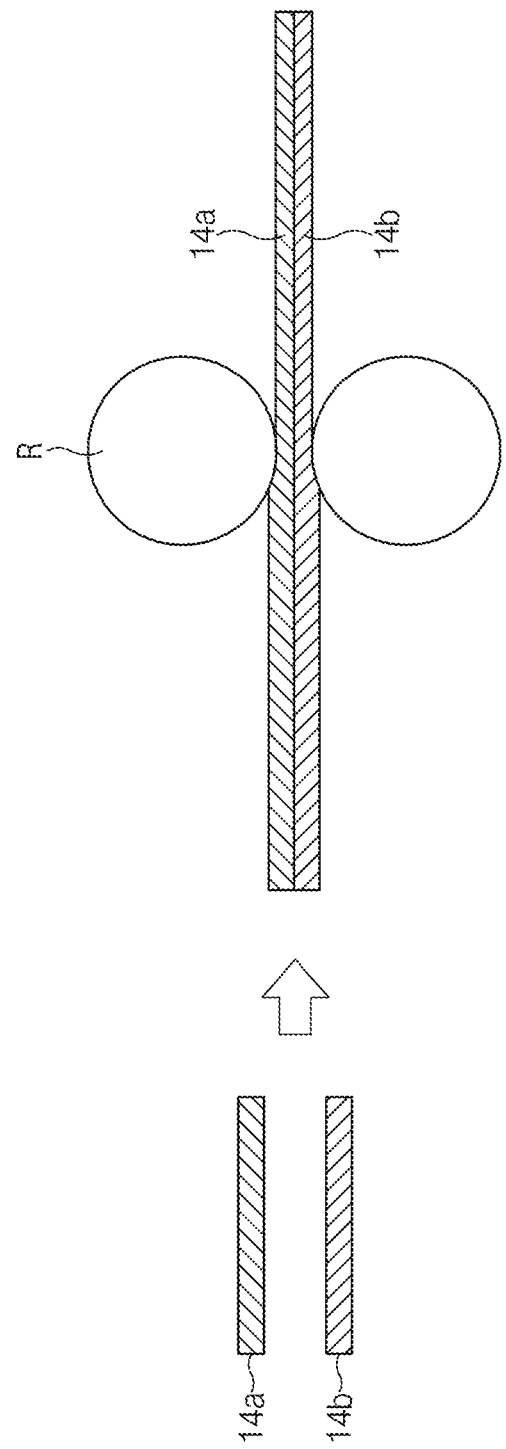

FIG. 2 is a view illustrating double layers stacked on a thermoelectric pellet, and FIGS. 3 and 4 are views illustrating a manner for stacking the double layers on the thermoelectric pellet.

As illustrated in FIG. 2, in the step (S10) of forming the thermoelectric pellet complex 10, the first double layer 14 is stacked on one end 12a of the thermoelectric pellet 12 and the second double layer 16 is stacked on another end 12b of the thermoelectric pellet 12, which is opposite to the one end 12a of the thermoelectric pellet 12, thereby forming the thermoelectric pellet complex 10.

The first double layer 14 has a structure in which two different layers are stacked in multiple steps. For example, the first double layer 14 includes a first diffusion barrier layer 14a stacked on the one end 12a of the thermoelectric pellet 12 and a first Cu layer 14b which is stacked on the first diffusion layer 14a in such a manner that the first Cu layer 14b is positioned farther away from the thermoelectric pellet 12 than the first diffusion barrier layer 14a, and contains copper (Cu). However, the present disclosure is not limited thereto, and the first double layer 14 may include a first Ni layer including nickel (Ni) instead of the first Cu layer 14b. The first diffusion barrier layer 14a is provided to prevent a composition of the thermoelectric pellet 12 from being diffused through the one end 12a of the thermoelectric pellet 12. To this end, the first diffusion barrier layer 14a may include at least one of tantalum (Ta), tungsten (W), and molybdenum (Mo).

The second double layer 16 also has a structure in which two different layers are stacked in multiple steps. For example, the second double layer 16 includes a second diffusion barrier layer 16a stacked on the opposite end 12b of the thermoelectric pellet 12 and a second Cu layer 16b which is stacked on the second diffusion layer 16a in such a manner that the second Cu layer 16b is positioned further away from the thermoelectric pellet 12 than the second diffusion barrier layer 16a and contains copper (Cu). However, the present disclosure is not limited thereto, and the second double layer 16 may include a second Ni layer including Ni instead of the second Cu layer 16b. The second diffusion barrier layer 16a is provided to prevent a composition of the thermoelectric pellet 12 from being diffused through the opposite end 12b of the thermoelectric pellet 12. To this end, the second diffusion barrier layer 16a may include at least one of Ta, W, and Mo.

The method for forming the thermoelectric pellet complex 10 by stacking the first double layer 14 and the second double layer 16 on both ends of the thermoelectric pellet 12 is not limited solely to any specific technique. For example, as illustrated in FIG. 3, after sequentially filling thermoelectric powders P1, which is able to form the thermoelectric pellet 12, and source materials P2 and P3 of the double layers 14 and 16 into a mold 2, a sintering process is performed with respect to the resultant structure at a specific sintering temperature under specific sintering pressure, thereby forming the thermoelectric pellet complex 10. The sintering temperature and the sintering pressure are not limited to a specific temperature or pressure value, respectively. For example, the sintering temperature may be in the range of 700° C. to 800° C., the sintering pressure may be in the range of 30 MPa to 60 MPa, and the sintering time may be in the range of 30 minutes to 100 minutes.

As another example, the double layers 14 and 16, which are previously formed, are stacked on both ends of the thermoelectric pellet 12, which is previously formed, through hot pressing, thereby forming the thermoelectric pellet complex 10. As illustrated in FIG. 4, the double layers 14 and 16 are preferably formed through a rolling process using a roll R after performing a plasma etching process with respect to the diffusion barrier layers 14a and 16a and the Cu layers 14b and 16b, but the present disclosure is not limited thereto.

As another example, the double layers 14 and 16 may be stacked on both ends of the thermoelectric pellet 12 through hot pressing, thereby forming the thermoelectric pellet complex 10.

As another example, the double layers 14 and 16 may be stacked on both ends of the thermoelectric pellet 12 through spray coating, thereby forming the thermoelectric pellet complex 10.

As another example, the double layers 14 and 16 may be stacked on both ends of the thermoelectric pellet 12 through plating, thereby forming the thermoelectric pellet complex 10.

Figure 5:
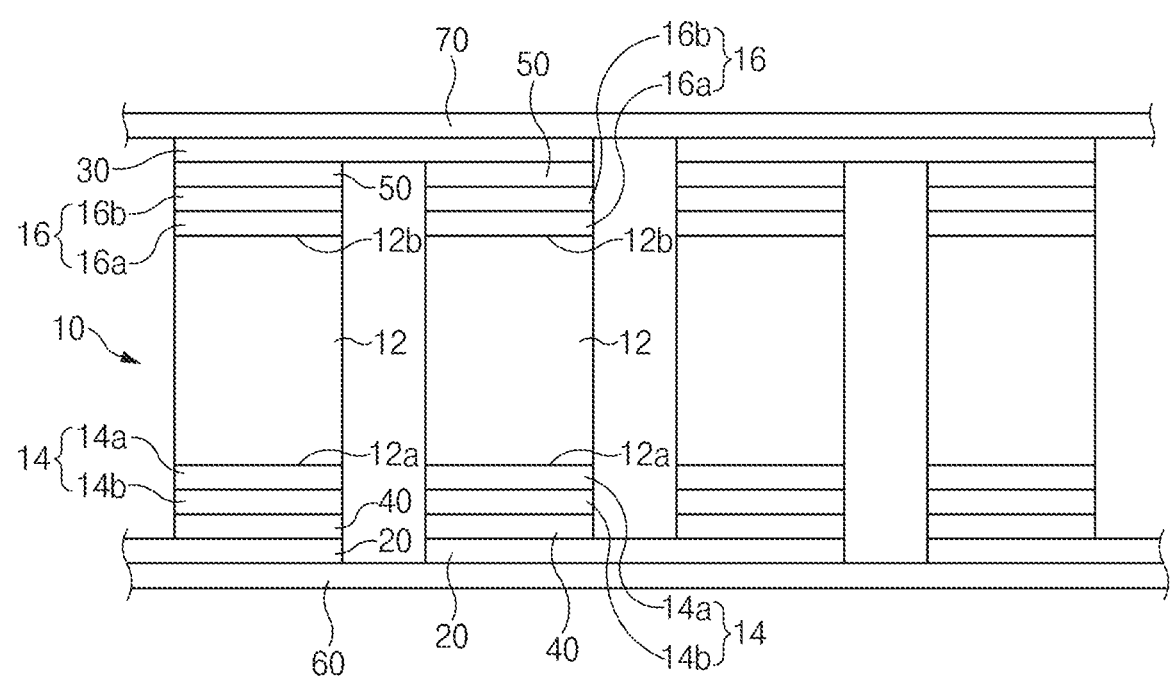
FIG. 5 is a front view of the thermoelectric module.

FIG. 5 is a front view of the thermoelectric module.

Next, in the step S20 of forming the first solder layer 40, the first solder layer 40 is formed by applying a first solder material to the first electrode 20 containing Cu. For example, as illustrated in FIG. 2, the first solder layer 40 including the first solder material may be formed on one surface of the first electrode 20 by applying the first solder material to one surface of the first electrode 20 which is previously stacked on one surface of a first substrate 60. The first substrate 60 preferably includes an insulating material such as ceramic, but the present disclosure is not limited thereto. As illustrated in FIG. 5, preferably, a plurality of first electrodes 20 are stacked on one surface of the first substrate 60 at specific distances, and a pair of first solder layers 40 including a first solder material are formed on each first electrode 20, but the present disclosure is not limited thereto.

The first solder material constituting the first solder layer 40 contains a Sn—Cu-based alloy. In addition, the first solder material may further contain silver (Ag). For example, the first solder material may contain 31.5 wt % to 96.5 wt % of Sn, 0.5 wt % to 68 wt % of Cu, and 1.5 wt % to 68 wt % of Ag.

Thereafter, according to the step (S30) of placing the thermoelectric pellet complex 10, the thermoelectric pellet complex 10 may be placed such that the first double layer 14 is seated on the first solder layer 40. For example, as illustrated in FIG. 5, each of a plurality of thermoelectric pellet complexes 10 may be placed such that the first Cu layer 14b of the thermoelectric pellet complex 10 is seated on the first solder layer 40 stacked on any one of first electrodes 20. However, the present disclosure is not limited thereto. For example, if the first double layer 14 includes the first Ni layer instead of the first Cu layer 14b, the thermoelectric pellet complexes 10 may be placed such that the first Ni layer of the thermoelectric pellet 12 is stacked on any one of the first electrodes 20.

Next, according to the step (S40) of forming the second solder layer 50, the second solder layer 50 is formed by applying a second solder material to the second electrode 30 containing Cu. For example, as illustrated in FIG. 2, the second solder layer 50 including the second solder material may be formed on one surface of the second electrode 30 by applying the second solder material to one surface of the second electrode 30 which is previously stacked on one surface of the second substrate 70. The second substrate 70 preferably includes an insulating material such as ceramic, but the present disclosure is not limited thereto. As illustrated in FIG. 5, preferably, a plurality of second electrodes 30 are stacked on one surface of the second substrate 70 at specific distances, and a pair of second solder layers 50 including the second solder material are formed in each second electrode 30, but the present disclosure is not limited thereto.

The second solder material constituting the second solder layer 50 contains a Sn—Cu-based alloy. In addition, the second solder material may further contain Ag. For example, the second solder material may contain 31.5 wt % to 96.5 wt % of Sn, 0.5 wt % to 68 wt % of Cu, and 1.5 wt % to 68 wt % of Ag.

Thereafter, in the step (S50) of placing the second electrode 30, the second electrode 30 may be placed such that the second solder layer 50 is seated on the second double layer 16. For example, as illustrated in FIG. 5, the second substrate 70 having the second electrodes 30 stacked thereon may be placed such that the second solder layer 50 stacked on each of the second electrodes 30 is seated on any one of the thermoelectric pellet complexes. Then, as illustrated in FIG. 5, the thermoelectric pellet complexes 10, the electrodes 20 and 30, the substrates 60 and 70, and the solder layers 40 and 50 are aligned in a specific manner to form the thermoelectric module 1. Meanwhile, if the second double layer 16 includes the second Ni layer instead of the second Cu layer 16b, the second substrate 70 having the second electrodes 30 stacked thereon may be placed such that the second solder layer 50 stacked on each of the second electrodes 30 is seated on the second Ni layer of any one of the thermoelectric pellet complexes 10.

Figure 6:
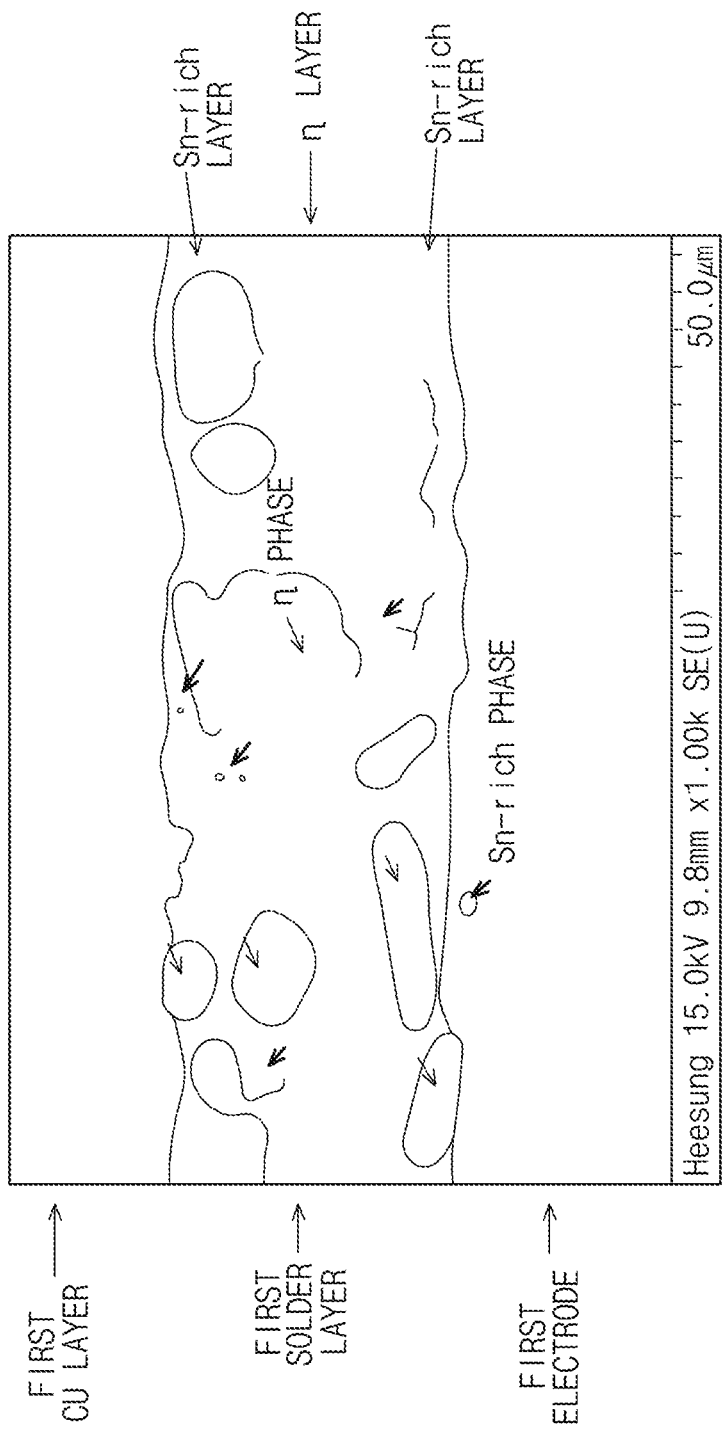
FIG. 6 is a scanning electron microscope (SEM) image illustrating a solder layer having a Sn-rich phase and a η phase.
Figure 7:
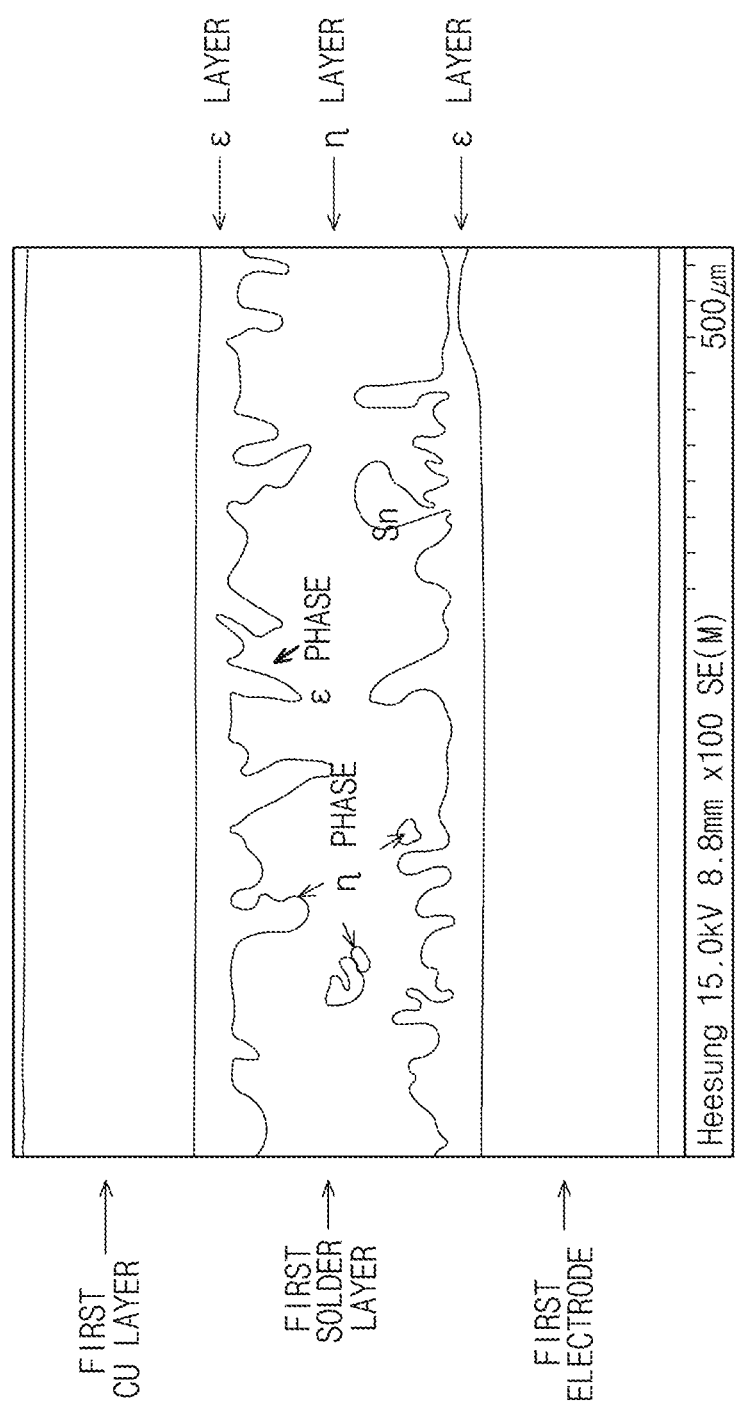
FIG. 7 is an SEM image illustrating a solder layer having an ε phase.

FIG. 6 is a scanning electron microscope (SEM) image illustrating a solder layer having a Sn-rich phase and a η phase, and FIG. 7 is an SEM image illustrating a solder layer having an ε phase.

In the step (S60) of bonding the double layers 14 and 16 of the thermoelectric pellet complex 10 to the electrodes 20 and 30 using the solder layers 40 and 50, respectively, the thermoelectric module 1 is caused to pass through a reflow solder oven (not illustrated) in an atmosphere of 350° C. to 400° C. (i.e., a "first atmosphere"). Then, as illustrated in FIG. 6, in the process of causing the thermoelectric module 1 to pass through the reflow solder oven, the phase of the first solder layer 40 is changed such that the Sn-rich layer and the η layer are formed. However, the present disclosure is not limited thereto. For example, the process of bonding the double layers 14 and 16 to the electrodes 20 and 30 using the solder layers 40 and 50 may be performed through another device in addition to the reflow solder oven.

The Sn-rich layer refers to a layer mainly having Sn-rich phases and the η layer refers to a layer having both η phases ($Cu_6Sn_5$) and Sn. As illustrated in FIG. 6, Sn-rich layers are formed on an upper portion and a lower portion of the first solder layer 40 to form bonding interfaces with the first Cu layer 14b and the first electrode 20, respectively, and the η layer is formed at the central portion of the first solder layer 40 to be interposed between the Sn-rich layers. The first solder layer 40 may be interposed between the first Cu layer 14b and the first electrode 20 to bond the first Cu layer 14b to the first electrode 20.

In the case of even the second solder layer 50, the Sn-rich layers are formed on an upper portion and a lower portion of the second solder layer 50 to form bonding interfaces with the second Cu layer 16b and the second electrode 30, and the η layer is formed at the central portion of the second solder layer 50 to be interposed between the Sn-rich layers, thereby bonding the second Cu layer 16b to the second electrode 30.

Thereafter, in the step (S70) of performing the heat treatment, the heat treatment is performed with respect to the thermoelectric module 1 such that at least one ε layer having ε phases ($Cu_3Sn$) is formed at each of the solder layers 40 and 50 to form the bonding interface with any one of the Cu layers 14b and 16b and the electrodes 20 and 30. The heat treatment for the thermoelectric module 1 is preferably performed at a temperature which is higher than the bonding temperature between the thermoelectric pellet complex 10 and the electrodes 20 and 30 and sufficient to prevent the thermoelectric pellet 12 and other elements included in the thermoelectric module 1 from being thermally damaged. For example, the heat treatment for the thermoelectric module 1 may be performed in an atmosphere of at least 400° C. and less than 500° C. (i.e., a "second atmosphere"). The heat treatment manner for the thermoelectric module 1 is not limited to a specific technique. For example, the heat treatment may be performed with respect to the thermoelectric module 1 by causing the thermoelectric module 1 to pass through an inner part of the reflow solder oven (not illustrated) in the second atmosphere of 400° C. to 500° C.

If the thermoelectric module 1 is subject to the heat treatment, Cu contained in the first Cu layer 14b is diffused to the Sn-rich layer formed on the upper portion of the first solder layer 40 through the bonding interface between the first Cu layer 14b and the first solder layer 40, and Cu contained in the first electrode 20 is diffused to the Sn-rich layer formed at the lower portion of the first solder layer 40 through the bonding interface between the first electrode 20 and the first solder layer 40.

As illustrated in FIG. 7, copper (Cu) diffused from the first Cu layer 14b and the first electrode 20 change the Sn-rich phase and the η phase ($Cu_6Sn_5$), which are distributed in the Sn-rich layers and the η layer, to ε phases ($Cu_3Sn$). The phase changes of the Sn-rich phase and the η phase ($Cu_6Sn_5$) gradually progress from the bonding interface between the first solder layer 40 and the first Cu layer 14b and the bonding interface between the first solder layer 40 and the first electrode 20 toward the central portion of the first solder layer 40. Accordingly, the Sn-rich phase positioned at the Sn-rich layer is changed to the ε phase ($Cu_3Sn$) earlier than the η phase ($Cu_6Sn_5$) positioned at the η layer. Therefore, as illustrated in FIG. 7, the Sn-rich layers may be subject to the phase-change to have both the ε phase ($Cu_3Sn$) and Cu due to Cu diffused from the first Cu layer 14b or the first electrode 20. In other words, each Sn-rich layer is subject to the phase change to the ε layer having both the ε phase ($Cu_3Sn$) and Cu. In addition, the η layer is subject to the phase change to have all of the η phase ($Cu_6Sn_5$), the ε phase ($Cu_3Sn$), and Sn due to Cu diffused from the first Cu layer 14b or the first electrode 20. The distribution ratio between the η phase ($Cu_6Sn_5$) and Sn at the η layer may be determined depending on the thickness of the first solder layer 40. For example, if the first solder layer 40 is formed to have the thin thickness of about 30 um to about 50 um, the η layer is subject to the phase change to mainly have the ε phase ($Cu_3Sn$). In other words, if the first solder layer 40 is formed to have the thinner thickness, most parts of the first solder layer 40 is phase-changed to a ε layer mainly having the ε phase and Cu.

In addition, similarly to the first solder layer 40, if the thermoelectric module 1 is subject to the heat treatment, the Sn-rich phase and the η phase ($Cu_6Sn_5$) positioned at the second solder layer 50 are changed to the ε phase ($Cu_3Sn$) due to Cu diffused from the second Cu layer 16b and the second electrode 30. Accordingly, the ε layer having the ε phase ($Cu_3Sn$) and Cu is formed at the second solder layer 50.

Figure 8:
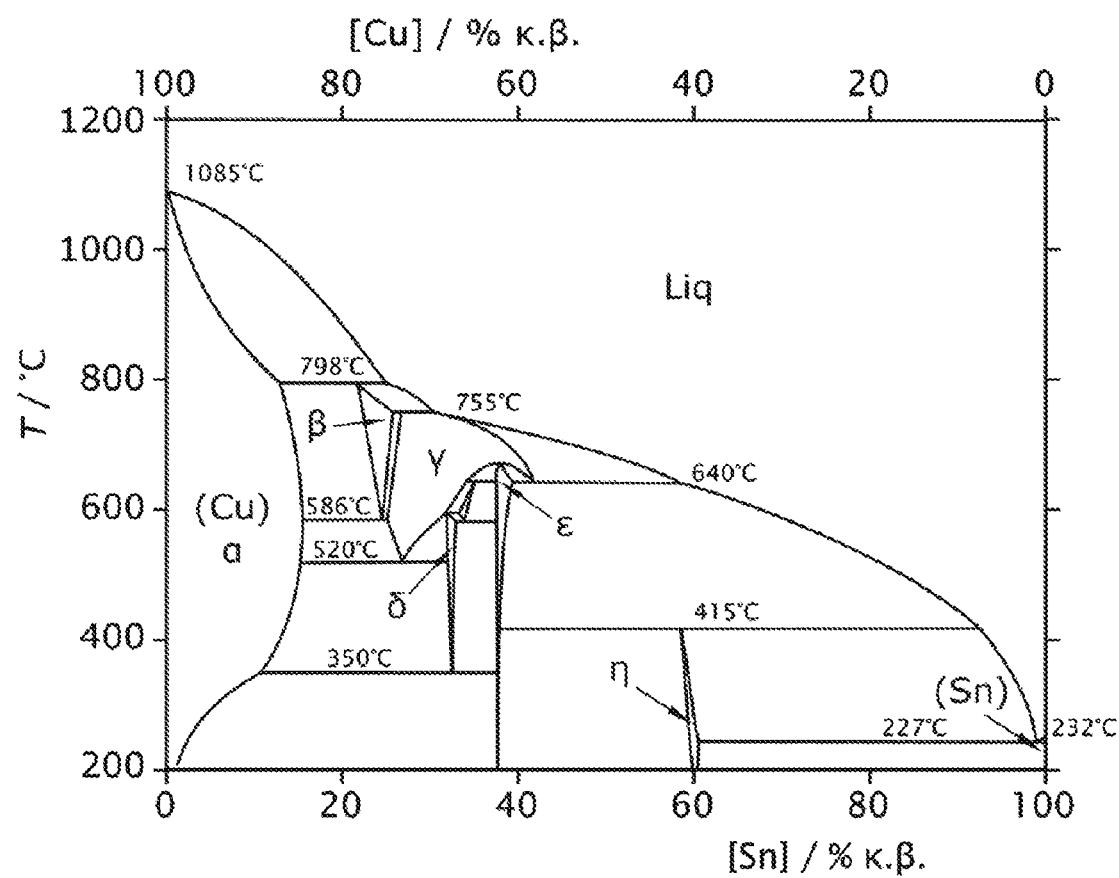
FIG. 8 is a graph illustrating the equilibrium state of two elements of Sn—Cu.

As illustrated in FIG. 8, the melting point of the ε phase ($Cu_3Sn$) is higher than the melting point of the η phase ($Cu_6Sn_5$). In addition, the melting point of the ε phase ($Cu_3Sn$) is higher than heat treatment temperature (in the range of 400° C. to 500° C.). In other words, the thermoelectric module 1 is subject to the heat treatment at the temperature sufficient to prevent the thermoelectric pellet 12 and other elements included in the thermoelectric module 1 from being thermally damaged. Accordingly, the solder layers 40 and 50 may be phase-changed to form the ε layers having the ε phase ($Cu_3Sn$) having the higher melting point.

According to embodiments of the present disclosure, in the method for manufacturing the thermoelectric module 1, after the thermoelectric pellet 12 is bonded to the electrodes 20 and 30 using the solder material having a lower melting point instead of an adhesive including a brazing material having a higher melting point, the solder material is phase-changed to have the higher melting point. As a result, manufacturing of the thermoelectric module 1 may be stably performed without the loss of the solder material even under a higher actual use temperature. Therefore, in the method for manufacturing the thermoelectric module 1 according to embodiments of the present disclosure, the process of bonding the thermoelectric pellet 12 to the electrodes 20 and 30 is not performed under the higher-temperature and vacuum environment, but the process of bonding the thermoelectric pellet 12 to the electrodes 20 and 30 and the heat treatment process for the thermoelectric module 1 may be performed at a temperature to minimize the thermal damage to the thermoelectric pellet 12 and other elements included in the thermoelectric module 1. A higher temperature and vacuum atmosphere can thereby be realized.

Furthermore, time to manufacture the thermoelectric module 1 may be reduced by performing the bonding process and the heat treatment process in the reflow solder oven having a lower temperature sufficient to perform the bonding process of a larger number of thermoelectric modules 1. The manufacturing cost of the thermoelectric module 1 may be reduced by manufacturing the thermoelectric module 1 using the solder material which has a lower cost than the brazing material.

Meanwhile, although the above description has been made in that the thermoelectric module 1 is subject to the heat treatment process after bonding the double layers 14 and 16 of the thermoelectric pellet complex 10 to the electrodes 20 and 30 using the solder layers 40 and 50, the present disclosure is not limited thereto. For example, if the actual use temperature of the thermoelectric module 1 corresponds to the heat treatment temperature (of 400° C. to 500° C.), the thermoelectric module 1 is not separately subject to the heat treatment, but the above-described ε layer may be formed through the actual use of the thermoelectric module 1.

Meanwhile, if the first double layer 14 and the second double layer 16 include the first Ni layer and the second Ni layer instead of the first Cu layer 14b and the second Cu layer 16b, Cu is not diffused from the thermoelectric pellet complex 10 to the first solder layer 40, but diffused only from the first electrode 20 to the first solder layer 40. Accordingly, if the first double layer 14 and the second double layer 16 include the first Ni layer and the second Ni layer instead of the first Cu layer 14b and the second Cu layer 16b, the ε layers are limitedly formed only at the interfaces between the solder layers 40 and 50 and the electrodes 20 and 30. However, since Ni represents the superior reactivity with Ag contained in the solder layers 40 and 50, even if ε layers are not formed at the interface between the Ni layers and the solder layers 40 and 50, the thermoelectric pellet complex 10 may be stably bonded to the electrodes 20 and 30 through the reaction between Ni and Ag.

As described above, the present disclosure relates to the thermoelectric module and the method for manufacturing the same and has the following effects.

First, the present disclosure may provide the thermoelectric module which may be stably used without the loss of the solder material under the higher-temperature actual use environment.

Second, the present disclosure may prevent the thermoelectric pellets or other elements included in the thermoelectric module from being damaged during the manufacturing of the thermoelectric module.

Third, the present disclosure may reduce time to be taken to manufacture the thermoelectric module by performing bonding processes for a larger number of thermoelectric modules in a lower-temperature reflow solder oven and may overcome the technical limitation in forming the higher temperature and vacuum atmosphere.

Fourth, the present disclosure may reduce the manufacturing cost of the thermoelectric module by manufacturing the thermoelectric module using the solder material having the price lower than that of a conventional brazing material.

Hereinabove, although the present disclosure has been described with reference to embodiments and the accompanying drawings, the present disclosure is not limited thereto, but may be variously modified and altered by those skilled in the art to which the present disclosure pertains without departing from the spirit and scope of the present disclosure claimed in the following claims.

Therefore, embodiments of the present disclosure are not intended to limit the technical spirit of the present disclosure, but provided only for the illustrative purpose. The scope of protection of the present disclosure should be construed by the attached claims, and all equivalents thereof should be construed as being included within the scope of the present disclosure.

What is claimed is:

1. A method for manufacturing a thermoelectric module, the method comprising:
   forming a thermoelectric pellet complex including a thermoelectric pellet and a double layer stacked on the thermoelectric pellet;
   bonding the double layer to an electrode using a solder layer interposed between the double layer and the electrode, the solder layer containing a Sn—Cu-based alloy; and
   performing heat treatment such that at least one ε layer having an ε phase ($Cu_3Sn$) is formed at the solder layer to form a bonding interface with one of the double layer and the electrode, wherein the performing of the heat treatment includes forming the at least one ε layer by changing at least a portion of a Sn-rich phase and a η phase ($Cu6Sn5$), which are formed at the solder layer, to the ε phase ($Cu3Sn$) due to Cu diffused from a Cu layer of the double layer or the electrode,
   wherein the bonding of the double layer to the electrode includes bonding the double layer to the electrode using the solder layer in a first atmosphere having a temperature which is greater than or equal to 350° C. and less than 400° C., and
   wherein the performing of the heat treatment includes performing the heat treatment in a second atmosphere having a temperature which is greater than or equal to 400° C. and less than 500° C.

2. The method of claim 1, wherein:
   the double layer includes:
     a diffusion barrier layer stacked on the thermoelectric pellet; and
     the Cu layer interposed between the diffusion barrier layer and the solder layer.

3. The method of claim 1, wherein the bonding of the double layer to the electrode further includes:
   causing a thermoelectric module, which is formed by aligning the thermoelectric pellet complex and the electrode such that the solder layer is interposed between the double layer and the electrode, to pass through a reflow solder oven.

4. The method of claim 1, wherein the performing of the heat treatment further includes:

causing a thermoelectric module, which is formed by aligning the thermoelectric pellet complex and the electrode such that the solder layer is interposed between the double layer and the electrode, to pass through a reflow solder oven.

5. The method of claim 1, wherein the double layer includes a diffusion barrier layer stacked on the thermoelectric pellet and an Ni layer stacked on the diffusion barrier layer to be interposed between the diffusion barrier layer and the solder layer.

6. The method of claim 1, wherein the solder layer contains 31.5 wt % to 96.5 wt % of Sn, 0.5 wt % to 68 wt % of Cu, and 1.5 wt % to 68 wt % of Ag.

7. The method of claim 1, wherein the forming of the thermoelectric pellet complex includes one of the following steps:

sintering thermoelectric powders to form the thermoelectric pellet and source materials to form the double layer;

stacking the double layer on the thermoelectric pellet, which is previously formed, through spray coating;

stacking the double layer, which is previously formed, on the thermoelectric pellet, which is previously formed, through hot pressing; and stacking the double layer on the thermoelectric pellet, which is previously formed, through plating.

* * * * *

UNITED STATES PATENT AND TRADEMARK OFFICE
CERTIFICATE OF CORRECTION

PATENT NO. : 11,355,688 B2  
APPLICATION NO. : 15/959182  
DATED : June 7, 2022  
INVENTOR(S) : Jin Woo Kwak et al.

Page 1 of 1

It is certified that error appears in the above-identified patent and that said Letters Patent is hereby corrected as shown below:

On the Title Page

Please replace item (73) the name of the Assignee "Hee Sung Metal LTD" with "LT Metal Co., Ltd.".

Signed and Sealed this  
Thirtieth Day of July, 2024

Katherine Kelly Vidal  
*Director of the United States Patent and Trademark Office*